United States Patent
Hayashi

(10) Patent No.: US 6,236,632 B1
(45) Date of Patent: May 22, 2001

(54) DISK DRIVER

(75) Inventor: Yasuhiro Hayashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/301,598

(22) Filed: Apr. 29, 1999

(30) Foreign Application Priority Data

Apr. 30, 1998 (JP) .................................................. 10-134212

(51) Int. Cl.$^7$ ........................................................ G11B 7/00
(52) U.S. Cl. ..................... 369/59.16; 369/59.21; 369/124.1; 369/124.13; 369/53.31; 369/44.35
(58) Field of Search ................................ 369/59, 124.04, 369/124.05, 124.1, 124.13, 124.14, 47, 48, 54, 44.34, 44.29, 44.35

(56) References Cited

U.S. PATENT DOCUMENTS

| 5,677,802 | * | 10/1997 | Saiki et al. | .................. | 369/59.22 |
| 5,995,465 | * | 11/1999 | Hayashi et al. | .................. | 369/124.13 |
| 6,052,350 | * | 4/2000 | Kura | .................. | 369/59.15 |
| 6,100,724 | * | 8/2000 | Yoshimura et al. | .................. | 369/53.34 |
| 6,111,846 | * | 8/2000 | Hayashi | .................. | 369/124.13 |
| 6,163,516 | * | 12/2000 | Ma | .................. | 369/59.24 |

FOREIGN PATENT DOCUMENTS 9-82028    3/1997   (JP) .

* cited by examiner

Primary Examiner—Thang V. Tran
(74) Attorney, Agent, or Firm—Oblon, Spivak, McClelland, Maier & Neustadt, P.C.

(57) ABSTRACT

Data read from a disk is input to an RF amplifier. An RF amplifier generates, based on bit data, an RF signal constituted by a plurality of components of mutually different frequencies. The RF amplifier determines a relation between the frequencies and gains on the basis of a control clock and adjusts the gains of respective components in the RF signals on the basis of the relation (equalize-processing). A PLL circuit has a first VCO and first frequency divider to generate a bit clock and generates, on the basis of an output signal of a data slice circuit, a first control voltage for controlling the first VCO. The first control voltage, being passed through a lowpass filter, is converted to a second control voltage for controlling a second VCO. The second VCO has an arrangement and characteristic substantially the same as those of the first VCO. A control clock for determining the peak position of the gain, that is, the characteristic of the RF amplifier, is generated based on an output clock of the second VCO.

20 Claims, 8 Drawing Sheets

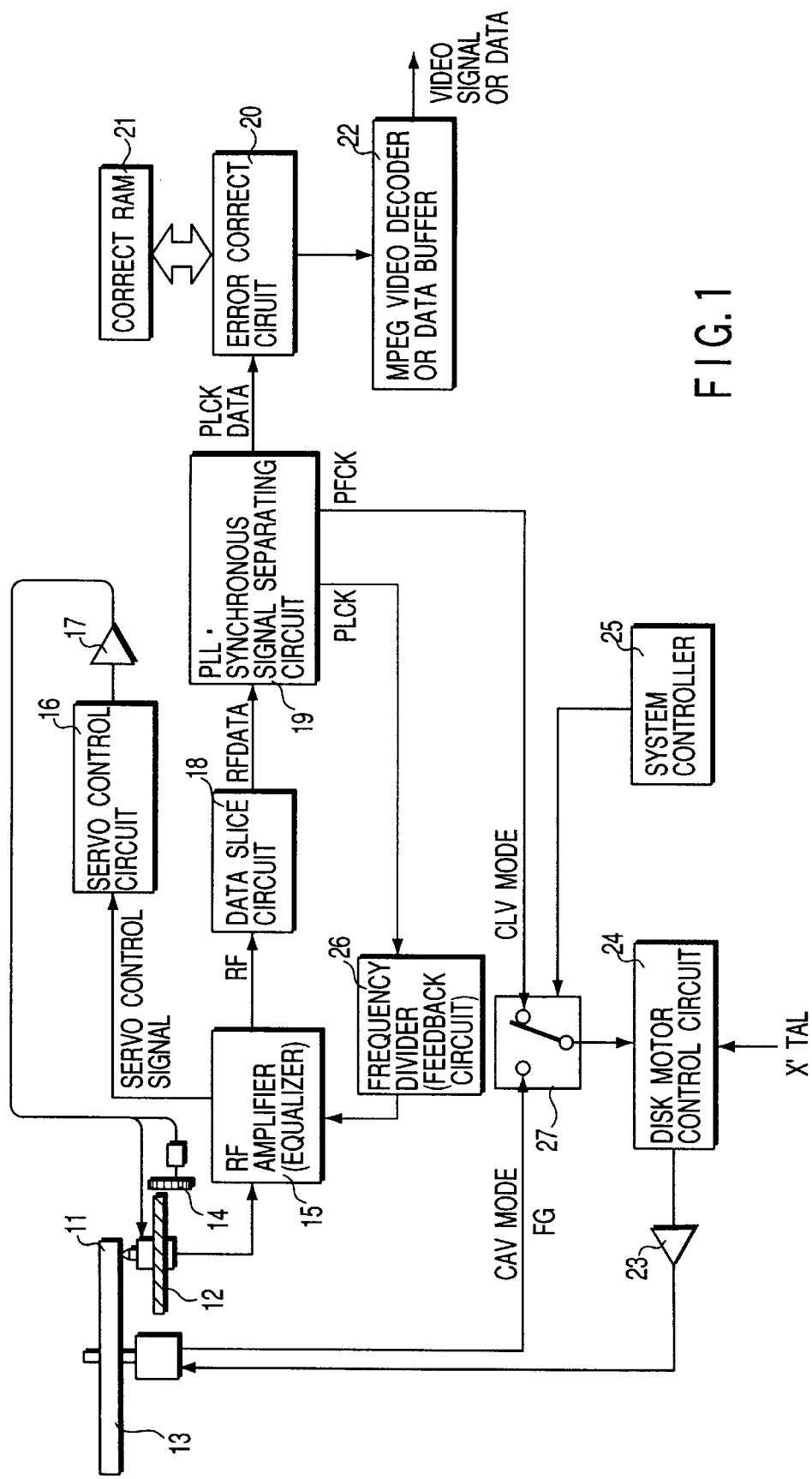
F I G. 1

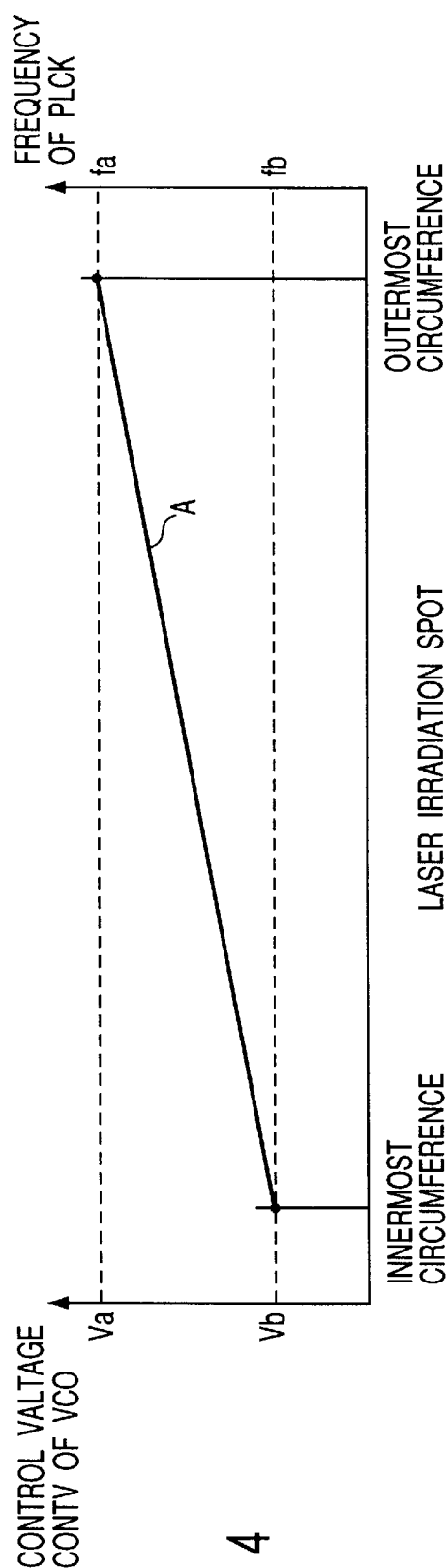
F I G. 4
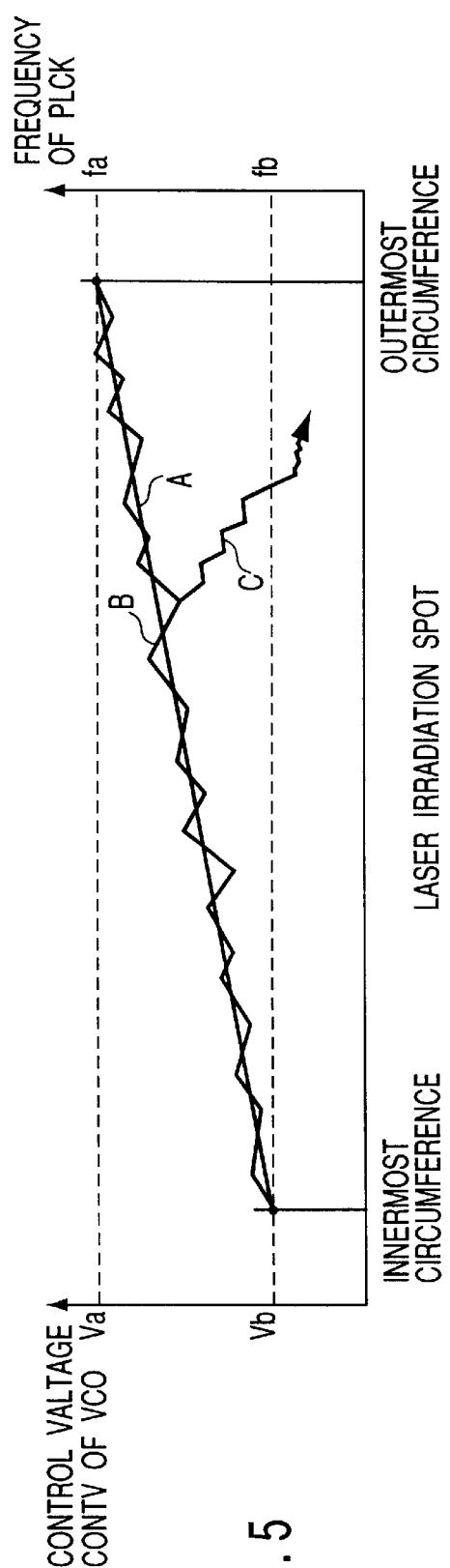
F I G. 5

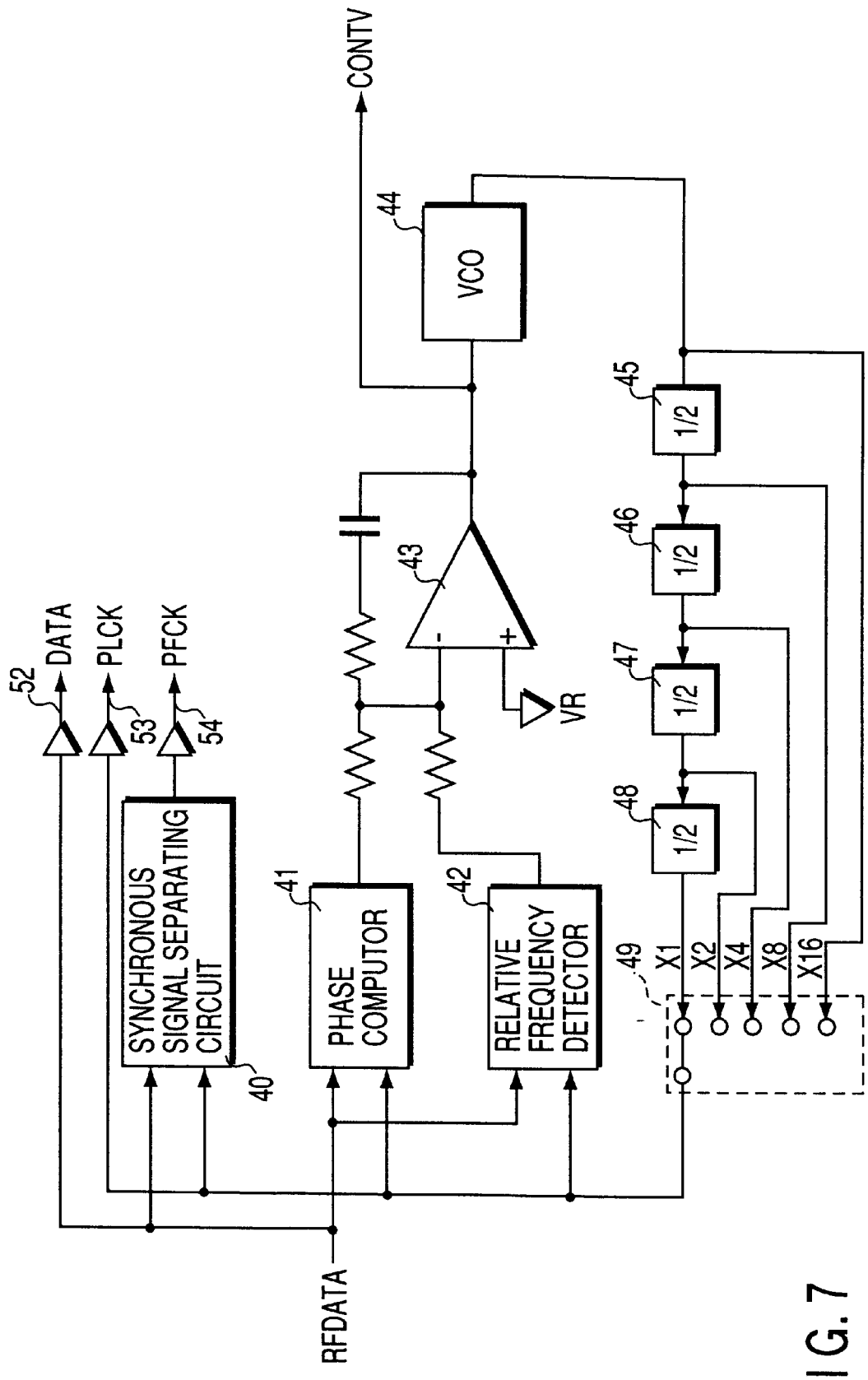
F I G. 7

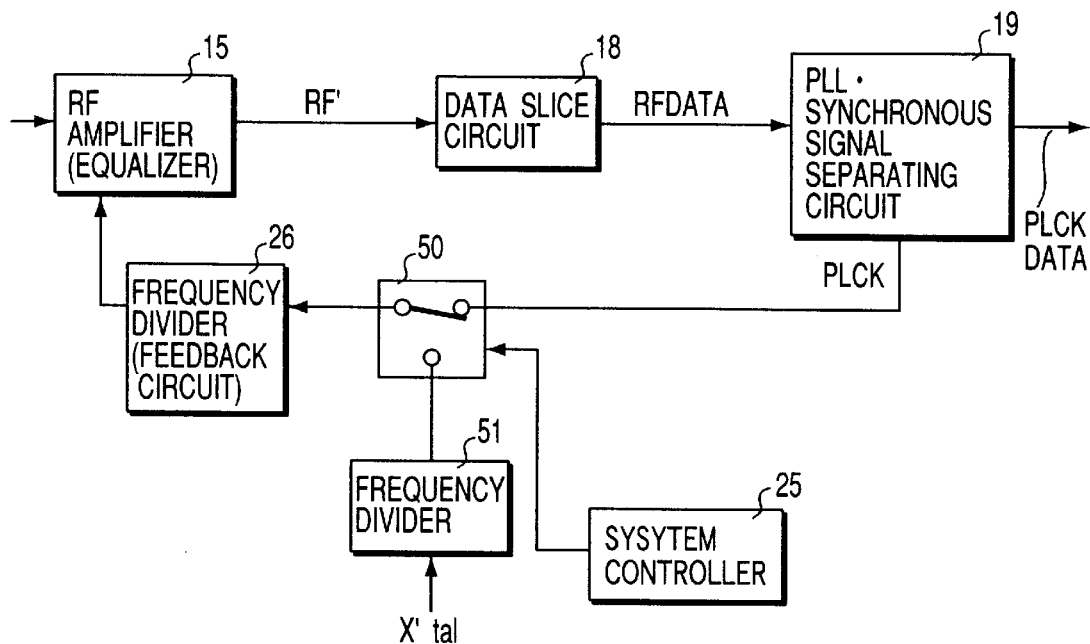
F I G. 10
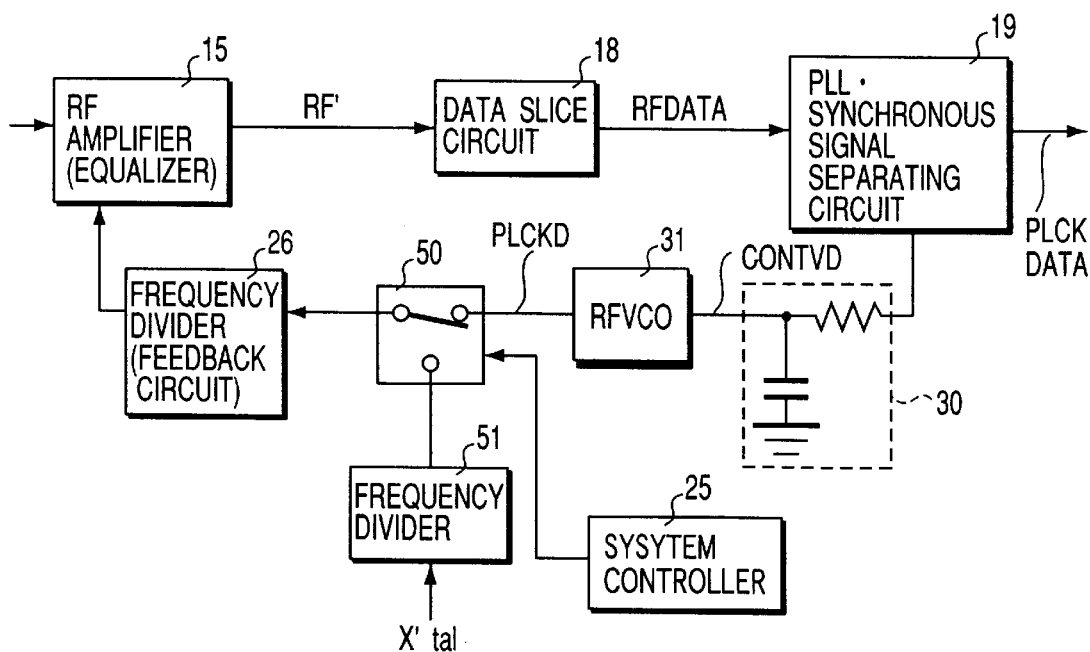
F I G. 11

DISK DRIVER

BACKGROUND OF THE INVENTION

The present invention relates to an RF amplifier control circuit of a disk driver and, in particular, to a DVD system.

FIG. 1 shows a conventional disk driver for use as parts of an audio-video apparatus or a computer peripheral equipment.

Data is stored as a pit array on a spiral track in a disk (CD, CD-ROM, CD-R, CD-RW, DVD-ROM, DVD-RAM, DVD-Audio, DVD-Video, etc.). The reproduction, that is, the reading, of the data is effected by irradiating the pit array on a disk 11 with a laser beam and detecting a reflected laser beam from the pit array.

Upon data reproduction, the rotation speed of the disk 11 is controlled by a disk motor 13 in accordance with a data reproduction scheme. That is, upon CLV (Constant Linear Velocity) reproduction, the rotation speed of the disk is varied so as to make the rate of read data constant and, upon CAV (Constant Angular Velocity) reproduction, the rotation speed of the disk is made constant.

A laser beam is generated and detected at a pickup 12. The laser beam detected at the pickup 12 is converted to an electric signal (pit data) and the pit data is transferred to an RF amplifier 15. The pickup 12 is moved by a servo motor 14 and upon normal reproduction, the pickup 12 is slowly moved in a radial direction as the scanning of the laser beam is made on the track. At a time of a seek operation, the pickup 12 is rapidly moved in the radial direction of the disk 11 across the track.

An RF amplifier 15 generates a servo control signal and RF signal on the basis of the pit data. A servo control circuit 16 generates a servomotor drive signal on the basis of a servo control signal. The servomotor drive signal is supplied through a driver 17 to the servomotor 14. A data slice circuit 18 generates digital data RFDATA on the basis of an RF signal. That is, digital data RFDATA can be obtained by detecting a DSV (Digital Sum Value) containing the RF signal and converting each component in the RF signal to a binary equivalent.

A PLL (Phase Locked Loop)•synchronous signal separating circuit 19 extracts data DATA from the digital data RFDATA, a bit clock PLCK and a synchronous signal PFCK. The data DATA and bit clock PLCK are input to an error correct circuit 20. In the error correct circuit 20, the correction of error data is made using a correct RAM 21.

For the case of a DVD-video for instance, the output data of the error correct circuit 20 is input to an MPEG video decoder 22. The MPEG video decoder 22 outputs a video signal. For the case of a DVD-ROM, the output data of the error correct circuit 20 is input to data buffer 22 and the data buffer 22 outputs the data. The data is transferred to, for example, a computer.

The bit clock PLCK is input to a frequency divider 26. The frequency divider 26 converts the frequency of the bit clock PLCK to a ¼ (N: an integer). The output signal of the frequency divider 26 is input to the RF amplifier 15. This feedback loop is used to obtain the characteristic (relation between the frequency and a gain) of the RF amplifier corresponding to the data rate of the read data.

A system controller 25 controls a switch circuit 27. For the case of the CLV reproduction, a synchronous signal PFCK representing the data rate is supplied to a disk motor control circuit 24. For the case of a CAV reproduction, a signal FG representing the rotation speed (angular velocity) is applied to the disk motor control circuit 24. The disk motor control circuit 24 generates, based on the clock generated at a crystal oscillator and synchronous signal PFCK or signal FG, a disk motor drive signal which sets a linear velocity (for the case of the CLV reproduction) or angular velocity (for the case of the CAV reproduction) constant. The disk motor drive signal is supplied through a driver 23 to the disk motor 13.

FIG. 2 shows one practical form of the PLL-synchronous signal separating circuit.

Digital data RFDATA output from the data slice circuit is input to a synchronous signal separating circuit 40, phase comparator 41 and relative frequency detector 42. Data DATA is created from the digital data RFDATA. A synchronous signal PFCK is output from the synchronous signal separating circuit 40. An output voltage CONTV of a filter amplifier 43 is determined by an output signal of the phase comparator 41 and output signal of the relative frequency detector 42. A VCO (Voltage Controlled Oscillator) 44 is controlled by the output voltage CONTV.

In this example, the frequency of the output clock of the VCO 44 is converted by frequency dividers 45 to 48 and selector 49 to $\frac{1}{2}^n$ times (n=0, 1, 2, 3, 4). That is, through the switching of the selector 49 in accordance with the data rate, the frequency division ratio of the output clock of VCO 44 is selected from five combinations (x1, x2, x4, x8, x16). The selector 49 is controlled by a system controller.

The output clock of the selector 49 which has a frequency corresponding to the data rate becomes a bit clock PLCK. Thus the bit clock PLCK is synchronous with the data rate. Further, the bit clock PLCK is input to the synchronous signal separating circuit 40, phase comparator 41 and relative frequency detector 42. Thus the synchronous signal PFCK is also synchronized with the data rate.

The data DATA, bit clock PLCK and synchronous signal PFCK are passed through buffers 52, 53 and 54 and output from the PLL-synchronous signal separating circuit.

The data reproduction method for the disk driver are two kinds: a CLV (Constant Linear Velocity) and CAV (Constant Angular Velocity). In recent years, however, a mainstream has been changed from a system for rotating a disk at a CLV velocity toward a system for rotating a disk at a CAV velocity. The reason is that it is not necessary to change the rotation velocity of the disk for CAV reproduction.

Explanation will be given below about the CLV reproduction and CAV reproduction.

The CLV reproduction is characterized in that, by the rotation velocity of the disk, the velocity (linear velocity) at which the scanning of a laser beam is made on the track of the disk is made constant and hence the rate of the read data is made constant even on any position (radial direction) on the disk. For the CLV reproduction, the data rate is made at all times constant from an innermost circumference to an outermost circumference of the disk and there is an advantage that the processing of the data is easier and less error is produced.

In the CLV reproduction, however, the rotation velocity of the disk varies as set out above. Stated in more detail, the scanning rate of the laser beam at a normal reproduction time is proportional to the irradiation position (radial direction) of the laser and, in order to make the scanning rate of the laser beam constant, the rotation speed of the disk has to be lowered as the irradiation position of the laser beam is moved from the innermost circumference side to the outermost side of the disk. And the maximum value of the rotation speed of the disk becomes about 2.5 times the minimum value.

On the other hand, on the disk drive apparatus used as a computer peripheral equipment, the seek operation (the operation by which the irradiation position of the laser beam is moved across the track) is effected very frequently. For the above-mentioned CLV reproduction, each time the seek operation is effected, the rotation speed of the disk has to be varied greatly.

If the rotation speed of the disk is varied more number of times, there is a disadvantage that a vast power consumption of the disk motor occurs in the driving of the disk. Further, as the power consumption is increased, more heat is generated in the disk motor, thus exerting a bad influence over the driving of the disk drive.

For the CAV reproduction, on the other hand, the advantage of the CLV reproduction acts as a disadvantage and the disadvantage of the CLV reproduction as an advantage. That is, for the CAV reproduction, the rotation speed (angular velocity) of the disk is made at all times constant and the power consumption and heat generation are suppressed to a minimum extent.

For the CAV reproduction, the data rate is varied unlike the CLV reproduction. Stated in more detail, the data rate, that is, the scanning rate (linear rate) of the laser on the disk becomes higher as the irradiation position (radial direction) of the laser beam is moved from the inner circumference side to the outer circumference side. And the maximal value (outermost circumference) of the scanning rate (data rate) of the laser beam becomes about 2.5 times the minimum value (innermost circumference).

In the CD system and DVD system, a plurality of signals having various periods (or frequencies) are contained in the RF signal. For the CD system, for example, a plurality of signals having a period from 3T to 11T are contained where T varies depending upon the data rate. In the DVD system, on the other hand, a plurality of signals are contained having a period from 3T to 14T.

These signals having the different periods have their different amplitudes. For the CD system, it is not performed the equalize-processing because of the CD has a low recording density, therefore, each signal in the RF signal can be accurately converted to a binary equivalent and to achieve a CAV reproduction. For the DVD system, the recording density of the data in the disk is about seven times in comparison with that for the CD system. For the DVD system, therefore, in order to accurately convert the RF signal to a binary equivalent, it is necessary to perform RF equalize processing, that is, make the amplitudes of a plurality of signals by an RF amplifier of a predetermined characteristic (narrow a difference in amplitude of a plurality of signals).

For the DVD system, on the other hand, the data rate of the read data becomes gradually higher, upon CAV reproduction, from the innermost circumference to the outermost circumference of the disk since the rotation speed of the disk is made constant. Further, since that the data rate becomes higher means that an amount of data read in a given period of time is increased, when the data rate becomes higher, the period 3T to 14T of each signal in the RF signal becomes shorter (the frequency becomes higher).

Thus, upon the CAV reproduction, as shown in FIG. 3, the characteristic of the RF amplifier (relation between the frequency and the gain) need to be varied in accordance with a variation of the frequency (period 3T to 14T) in the RF signal. That is, since, upon CAV reproduction, the data rate becomes suddenly higher by the seek action for example, the peak of a gain need be shifted to a higher frequency side (f1→f2→f3) in accordance therewith, while, on the other hand, when the data rate becomes suddenly lower by the seek action, the peak of the gain need be shifted to a lower frequency side (f3→f2→f1) in accordance therewith.

In the DVD system, the equalize processing at the RF amplifier exerts an influence over the probability of generating error data. That is, the accurate performing of the equalize processing at the RF amplifier produces less error and, for this reason, it is very important that the characteristic of the RF amplifier (position of the peak) accurately follow the data rate.

In the conventional disk driver, as shown in FIG. 1, the characteristic of the RF amplifier 15 is varied using the bit clock PLCK which is output from the PLL·synchronous signal separating circuit 19. The bit clock PLCK is accurately synchronized with the data rate. That is, in the conventional disk driver, the characteristic (position of the peak) of the RF amplifier 15 is so varied as to very rapidly follow a variation of the data rate.

FIG. 4 shows a variation between a control voltage CONTV of the VCO and the frequency of the bit clock PLCK in the case where the irradiation position of the laser beam is continuously (spirally) varied along on the track from the innermost circumference toward the outermost circumference.

The frequency of the bit clock PLCK is proportional to the control voltage CONTV of the VCO. The frequency of the bit clock PLCK becomes fa when the control voltage CONTV of the VCO is Va and becomes fb when the control voltage CONTV of the VCO is Vb, noting that fa/fb is 2.5.

In this case, with an increase of the data rate, the control voltage CONTV of the VCO varies at a rate of a given change from the Vb to the Va. At the same time, the frequency of the bit clock PLCK varies at a rate of a given change from fb to fa (line A). Hence, the peak of the gain at the characteristic of FIG. 3 continuously varies from a lower frequency $f_1$ to a higher frequency $f_3$.

In the case where, at the time of a normal reproduction, the irradiation position of the laser beam varies continuously (spirally) from the innermost circumference to the outermost circumference of the disk, the peak of the gain in the characteristic of FIG. 3 also varies to a high frequency in a way to accurately follow an increase of the data rate.

However, a problem arises at a time of a seek motion, for example, in the case where the irradiation position of the laser beam is rapidly varied from the innermost circumference toward the outermost circumference of the disk.

FIG. 5 shows a variation between the control voltage CONTV of the VCO and the frequency of the bit clock PLCK at a time of the seek time, in the case where the irradiation position of the laser beam is rapidly varied from the innermost circumference toward the outermost circumference of the disk.

In this example, the irradiation position of the laser beam is not varied spirally along the track but moved across the track, so that the data rate at the seek time becomes irregularly higher. For this reason, the control voltage CONTV of the VCO is made irregularly higher from Vb to Va and the frequency of the bit clock PLCK goes irregularly higher from fb to fa (line B).

As a result, the peak of the gain for the characteristic of FIG. 3 is irregularly varied, not continuously varied from a lower frequency f1 to a higher frequency $f_3$. As a result, it becomes impossible to effect the accurate detection of the frequency as well as the comparison of the phases at the PLL•synchronous separating circuit. In an extreme case, there occurs a vicious cycle such that an abnormal variation in the control voltage CONTV of the VCO causes an abnormal variation in the position of the peak of a gain in the characteristic of FIG. 3 and that an abnormal variation in the position of the peak of the gain in the characteristic of FIG. 3 causes an abnormal variation in the control voltage CONTV of the VCO. If this occurs, the equalize control of the RF amplifier cannot be returned from the abnormal state back to a normal state (line C).

Even at a time of a normal reproduction, if the characteristic of the RF amplifier sensitively responds to the bit clock PLCK, then a jitter in the RF signal is increased and an error is liable to occur.

BRIEF SUMMARY OF THE INVENTION

It is accordingly an object of the present invention is to provide a disk driver which, even if at a time of a seek motion upon CAV reproduction there occurs an irregular variation in the data rate, produces less abnormal situations and, even if an RF amplifier control circuit is brought to an abnormal state, ensures an immediate recovery to a normal state and finally an accurate matching of the characteristic of the RF amplifier to the data rate subsequent to a seek operation.

In one aspect of the present invention, there is provided a disk driver comprising an equalizer, in regard to an RF signal constituted by a plurality of components of mutually different frequencies based on data read from a disk, determining a relation between the frequencies and gains based on a control clock and performing equalize-processing by adjusting the gains of the components based on the relation; a data slice circuit for converting the components to digital signal; a PLL circuit having a first VCO to generate a bit clock and generating a first control voltage for controlling the first VCO based on the digital signals; a lowpass filter generating a second control voltage based on the first control voltage; a second VCO controlled by a second control voltage based on the first control voltage and having an arrangement and characteristic substantially equal to those of the first VCO; and a feedback circuit generating a control clock based on a clock output from the second VCO and supplying the control clock to the equalizer.

In another aspect of the present invention, there is provided a disk driver comprising an equalizer, in regard to an RF signal constituted by a plurality of components of mutually different frequencies based on data read from a disk, determining a relation between the frequencies and gains based on a control clock and performing equalize-processing by adjusting the gains of the components based on the relation; a data slice circuit converting the components to digital signals; a PLL circuit having a VCO to generate a bit clock and generating a control voltage for controlling the VCO based on the digital signals; a feedback circuit generating a control clock based on either one of the bit clock and clock of a predetermined frequency and supplying the control clock to the equalizer; and a selector for supplying either one of the bit clock and clock of a predetermined frequency to the feedback circuit.

In still another aspect of the present invention there is provided a disk driver comprising an equalizer, in regard to an RF signal constituted by a plurality of components of mutually different frequencies based on data read from a disk, determining a relation between the frequencies and gains based on a control clock, and performing equalize-processing by adjusting the gains of the components based on the relation; a data slice circuit converting the components to digital signals; a PLL circuit having a first VCO to generate a bit clock and generating a first control voltage for controlling the first VCO based on the digital signals; a lowpass filter generating a second control voltage based on the first control voltage; a second VCO controlled by the second control voltage and having an arrangement and characteristic substantially equal to those of the first VCO; a feedback circuit generating a control clock based on either one of a clock output from the second VCO and clock of a predetermined frequency and supplying the control clock to the equalizer; and a selector for providing either one of the clock output from the second VCO and clock of a predetermined frequency to the feedback circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing a conventional disk driver;

FIG. 4 is a view showing a variation of a control voltage CONTV and variation in frequency of a PLCK upon normal reproduction;

FIG. 5 is a view showing a variation of a control voltage CONTV and a variation of a frequency of a PLCK at a time of a seek operation;

FIG. 7 is a view showing, in more detail, a PLL-synchronous signal separating circuit of FIG. 6;

FIG. 10 is a view showing a major section (RF amplifier control circuit) of a disk driver according to a second invention of the present invention; and FIG. 11 is a view showing a major section (RF amplifier control circuit) of a disk driver according to a third embodiment of the present invention.

DETAILED DESCRIPTION OF THE INVENTION

Figure 2:
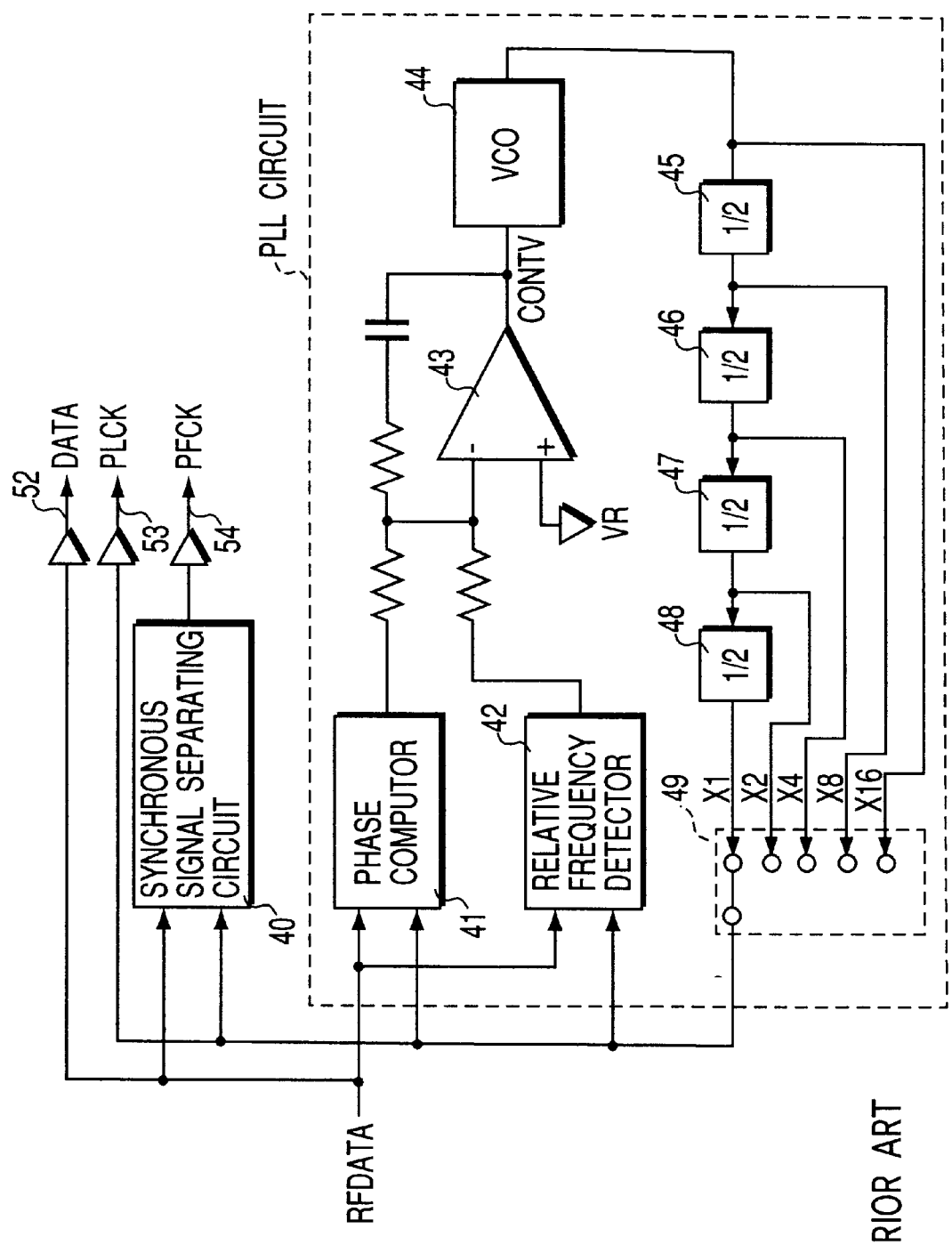
FIG. 2 is a view showing a PLL•synchronous signal separating circuit in FIG. 1.

A disk driver of the present invention will be explained in more detail below with reference to the drawing.

Figure 6:
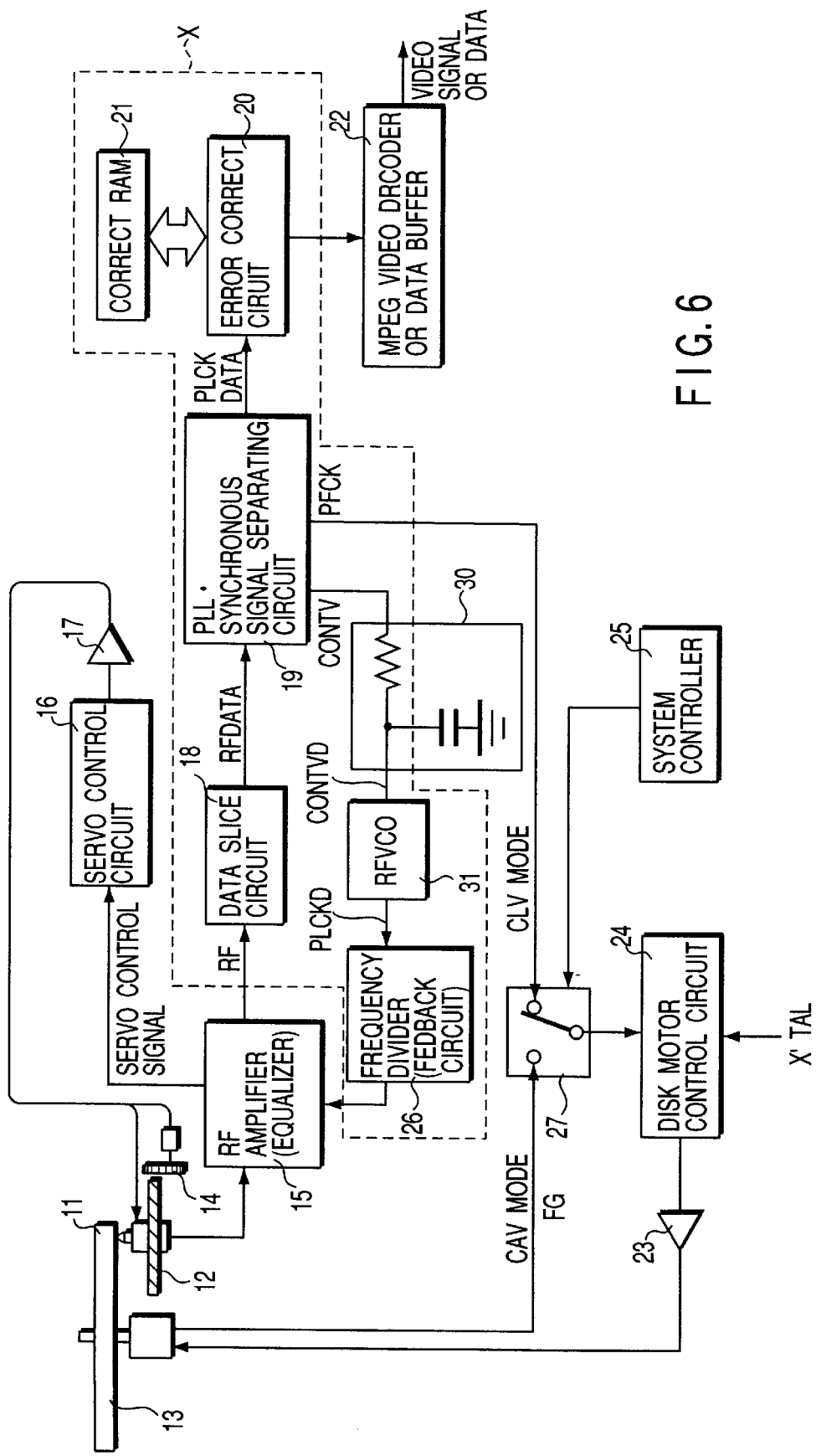
FIG. 6 is a view showing a disk driver according to a first embodiment of the present invention which is characterized by an RF amplifier circuit.

FIG. 6 shows a disk driver according to a first embodiment of the present invention which is used within an audio-video apparatus or as a computer peripheral equipment.

Data is stored as a pit array on a spiral track in a disk 11, such as a CD, CD-ROM, CD-R, CD-RW, DVD-ROM, DVD-RAM, DVD-Audio and DVD-Video. The reproduction, that is, the reading, of the data is carried out by irradiating, with a laser beam, a pit array on the disk 11 and detecting reflected laser beam from the pit array.

Upon data reproduction, the rotation speed of the disk 11 is controlled by a disk motor 13 in accordance with a data reproduction scheme. That is, upon constant linear velocity (CLV), the rotation speed of the disk is varied in order to make the rate of read data constant, while, upon constant angular velocity, the rotation speed of the disk is made constant.

The generation and detection of a laser beam are effected at a pickup 12 and the laser beam detected at the pickup 12 is converted to an electric signal (pit data). The pit data is transferred to an RF amplifier 15. The pickup 12 is driven by a servomotor 14. Upon normal reproduction, the pickup 12 is slowly moved in a radial direction to allow the scanning of a laser on the track. At a time of a seek operation, the pickup 12 is moved quickly in a radial direction of the disk 11 so as to cross the track.

The RF amplifier (including an equalizer) 15 generates a servo control signal and RF signal on the basis of the pit data. A servo control circuit 16 generates a servo motor drive signal on the basis of the servo control signal. The servo motor drive signal is fed through a driver 17 to the servo motor 14. The RF amplifier 15 has a function of an equalizer. Therefore, a gain of an RF signal is adjusted against a respective frequency component. Stated in more detail, with the gain of the high frequency component set "high", each frequency component (signal) in the RF signal has its amplitude made equal (equalize processed). A data slice circuit 18 generates digital data RFDATA on the basis of the RF signal. That is, the digital data RFDATA can be obtained by detecting a DSV (Digital Sum Value) and converting each component in the RF signal to a binary equivalent.

A PLL (Phase Locked Loop)•synchronous signal separating circuit 19 receives digital data RFDATA and delivers data DATA, bit clock PLCK and synchronous signal PFCK. The data DATA and bit clock PLCK are input to an error correct circuit 20. The error correct circuit 20 effects the correction of error data with the use of an error correct RAM 21.

And in the case of the DVD-Video for example, the output data of the error correct circuit 20 is input to an MPEG decoder 22. The MPEG decoder 22 outputs a video signal. In the case of the DVD-ROM, the output data of the error correct circuit 20 is input to a data buffer 22 and the data buffer 22 delivers an output as the data. The data above is transferred to, for example, a computer.

A voltage CONTV is used as a control voltage of a VCO (Voltage Controlled Oscillator) in the PLL•synchronous signal separating circuit and fed to a lowpass filter 30 which provides a control voltage CONTVD. The control voltage CONTVD is input to an RFVCO (RF Voltage Controlled Oscillator) 31. The arrangement and characteristic of the RFVCO 31 is substantially the same as those of the VCO in the PLL•synchronous signal separating circuit 19.

A clock PLCKD, generated at the RFVCO 31 is input to a frequency divider (feedback circuit) 26. The frequency divider 26 divides the frequency of the clock PLCKD to provide 1/N parts (N: an integer). The output signal of the frequency divider 26 is input to the R/F amplifier 15.

A feedback loop, comprising the lowpass filter 30, RFVCO 31 and frequency divider 26, is used to obtain the characteristic of the RF amplifier 15 (relation between the frequency and the gain) corresponding to the data rate of the read data.

A system controller 25 controls a switching circuit 27. For the CLV reproduction, the synchronous signal PFCK representing the data rate is supplied to a disk motor control circuit 24. For the CAV reproduction, a signal FG representing a rotation speed (angular velocity) of the disk is provided to the disk motor control circuit 24. Based on a clock generated from a crystal oscillator and synchronous signal PFCK or signal FG, the disk motor control circuit 24 generates such a disk motor drive signal as to set a linear velocity constant for the CLV reproduction or an angular velocity constant for the CAV reproduction. The disk motor drive signal is supplied through a driver 23 to the disk motor 13.

Those respective circuit blocks as indicated by a broken line in FIG. 6, that is, the data slice circuit 18, PLL•synchronous signal separating circuit 19, error correct circuit 20, correct RAM 21, frequency divider 26, a resister in the lowpass 30 and RFVCO 31, can be integrated in one chip. A resister in the RF amplifier 15 can be also integrated in the one chip. In particular, the VCO in the PLL-synchronous signal separating circuit 19 and RFVCO 31 can be formed in one chip and, in this case, the characteristics of these two VCO's can be almost fully matched.

FIG. 7 shows one practical form of the PLL•synchronous signal separating circuit.

The digital data RFDATA which is output from the data slice circuit is input to a synchronous signal separating circuit 40, phase comparator 41 and relative frequency detector 42. Data DATA is generated from the digital data RFDATA. A synchronous signal PFCK is output from the synchronous signal separating circuit 40. An output voltage CONTV of a filter amplifier 43 is determined by an output signal from the phase comparator 41 and output signal of the relative frequency detector 42. A VCO (Voltage Controlled Oscillator) 44 is controlled by the output voltage CONTV.

The control voltage CONTV of the VCO 44 is output from the PLL•synchronous signal separating circuit and supplied to the lowpass filter 30 in FIG. 6. Further, the arrangement of the VCO 44 is the same as that of the RFVCO 31 in FIG. 6. And the characteristic of the VCO 44 is also the same as that of the RFVCO 31 in FIG. 6.

In the present embodiment, the frequency of the output clock of the VCO 44 is divided by frequency dividers 45 to 48 and selector 49 into $\frac{1}{2}^n$ times frequencies (n=0, 1, 2, 3, 4). That is, the selector 49 is switched in accordance with the data rate and the frequency division ratio of the output clock of the VCO 44 is selected out of five combinations (x1, x2, x4, x8, x16). The selector 49 is controlled by the system controller 25 of FIG. 6.

The output clock of the selector 49 which has a frequency corresponding to the data rate becomes a bit clock PLCK, so that the bit clock PLCK is synchronized with the data rate. Further, the bit clock PLCK is input to the synchronous signal separating circuit 40, phase comparator 41 and relative frequency detector 42. As a result, the synchronous signal PFCK is also synchronous with the data rate.

The data DATA, bit clock PLCK and synchronous signal PFCK are output, respectively through buffers 52, 53 and 54, from the PLL•synchronous signal separating circuit.

For the DVD system, as set out above, the RF signal need be equalize-processed at the RF amplifier in order to effect an accurate binary conversion at the data slice circuit. Upon CAV reproduction, the data rate is varied unlike upon CLV reproduction. In order to make accurate equalize-processing, the characteristic of the RF amplifier (the peak position of the gain) has to be varied in accordance with a variation of the data rate.

According to the present invention, in order to vary the characteristic of the RF amplifier, use is made of the output clock PLCKD of the newly provided RFVCO, not the bit clock PLCK generated at the PLL•synchronous signal separating circuit. The RFVCO is controlled by the output voltage CONTVD of the lowpass filter. As a result, though the characteristic of the RF amplifier follows the variation of the data rate, the following characteristic is more lenient than in the conventional case.

Figure 8:
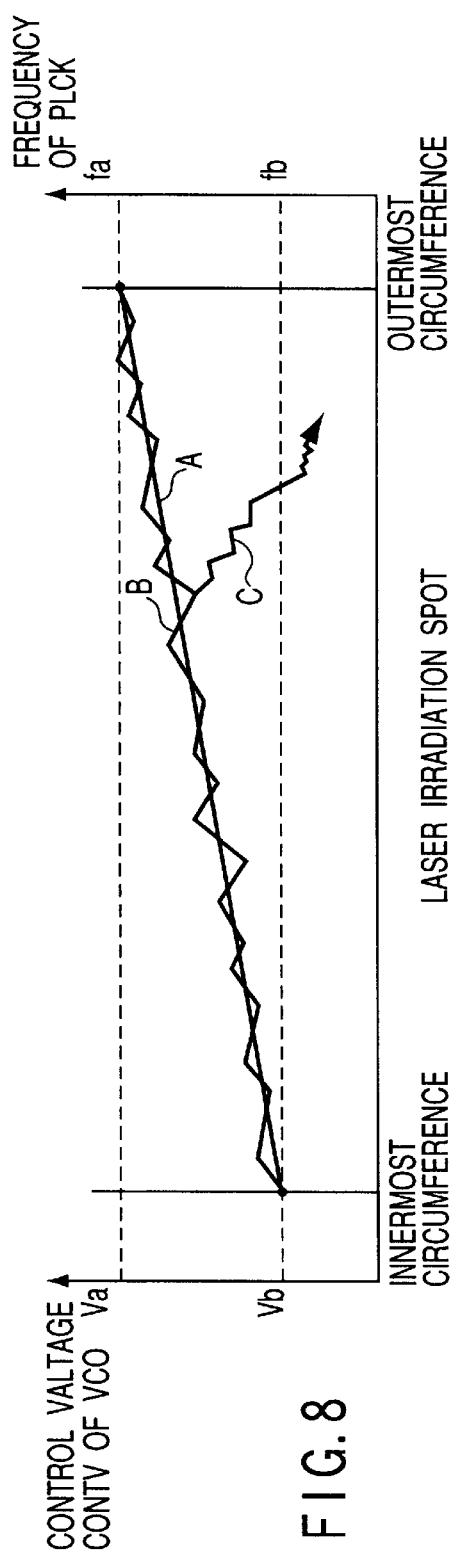
FIG. 8 is a view showing, upon normal reproduction at a time of a seek operation, a variation of a control voltage CONTV and a variation of a frequency of a PLCK.

FIG. 8 shows how the control voltage CONTV of the VCO and frequency of the bit clock PLCK vary between upon normal reproduction and upon seek operation.

The line A in FIG. 8 shows a variation in the control voltage CONTV of the VCO and variation in the frequency of the bit clock PLCK at a time of normal reproduction, that is, when the irradiation position of the laser beam varies continuously (spirally) along a track from an innermost circumference to an outermost circumference of the disk.

The frequency of the bit clock PLCK is proportional to the control voltage CONTV of the VCO. When the control voltage CONTV of the VCO is Va, the frequency of the bit clock PLCK is fa and, when the control voltage CONTV of the VCO is Vb, the frequency of the bit clock PLCK is fb, noting that fa/fb is 2.5.

Figure 3:
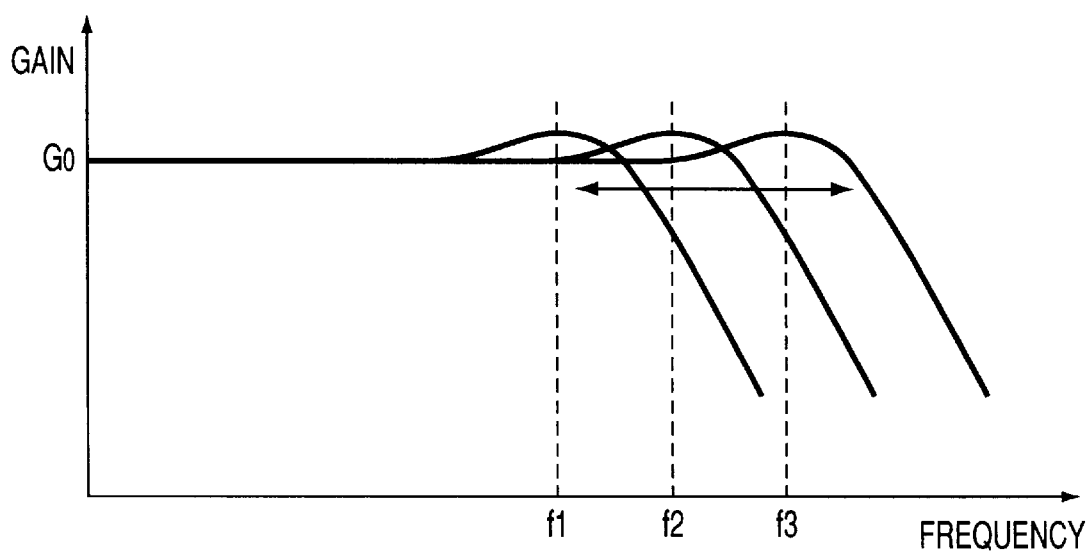
FIG. 3 is a view showing the characteristic of an RF amplifier (relation between frequencies and gains)

In this case, as the data rate is increased, the control voltage CONTV of the VCO varies at a rate of a given change from Vb to Va. The frequency of the bit clock PLCK varies at a rate of a given change from fa to fb. As a result, the peak of the gain in the characteristic of FIG. 3 varies continuously from a low frequency $f_1$ to a high frequency $f_3$.

The line B in FIG. 8 shows a variation in the control voltage CONTV of the VCO and variation in the frequency of the bit clock PLCK at a time of the seek operation, that is, when the irradiation position of the laser beam quickly varies from the innermost circumference to the outermost circumference.

In this case, the irradiation position of the laser beam is moved across the track, not varied spirally along the track. And the data rate at the time of a seek operation becomes irregularly high. For this reason, the control voltage CONTV of the VCO also becomes irregularly high from Vb to Va and the frequency of the bit clock PLCK irregularly goes high from fb to fa.

According to the present invention, the characteristic of the RF amplifier is varied by using the output clock PLCKD of the RFVCO (controlled by the output voltage of the lowpass filter), not the bit clock PLCK severely following the data rate. The output clock PLCKD more roughly follows the data rate than the bit clock PLCK. At a time of the seek operation upon CAV reproduction, the control voltage CONTV never goes in a wrong direction (line C) and the equalize function of the RF amplifier acts rightly.

Figure 9:
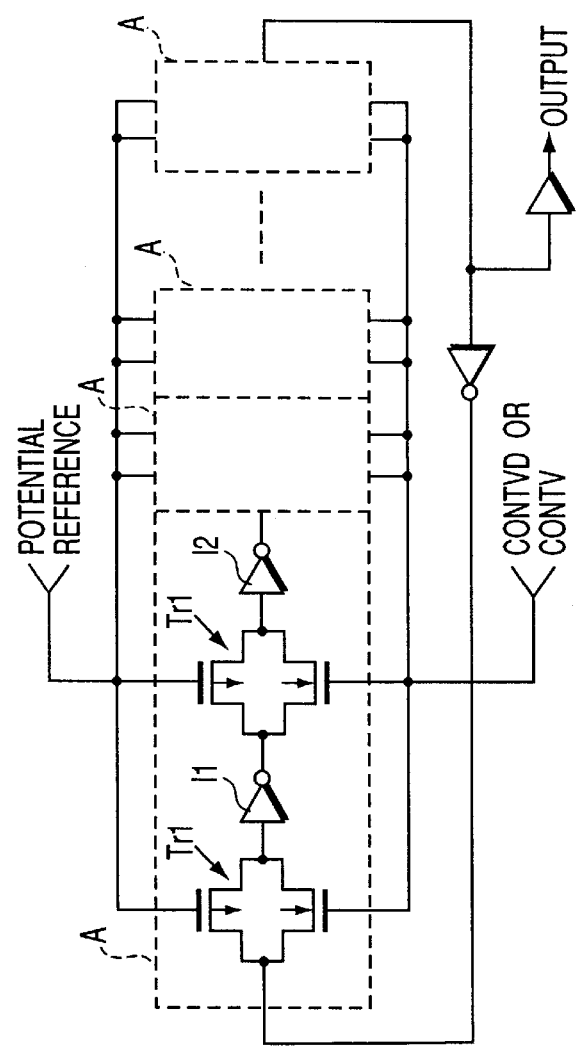
FIG. 9 is a view showing one practical form of a VCO.

FIG. 9 shows one practical form of the voltage controlled oscillator.

This form of the VCO is comprised of a ring oscillator having delay lines. As the RFVCO 31 in FIG. 6 and VCO 44 in FIG. 7 use is made of this form of VCO for example. In FIG. 9, each block A has the same configuration. The block A comprises transfer gates Tr1 and Tr2 each constituted by P- and N-channel MOS transistors and inverters 11 and 12.

A reference potential is applied to the gate of the P-channel MOS transistor and a control voltage CONTV or CONTVD is applied to the gate of the N-channel MOS transistor. In this practical form of VCO, the values of the control voltages CONTV and CONTVD are varied and, by doing so, the ON resistance of the MOS transistors in the transfer gate varies and the oscillation frequency of the VCO (ring oscillator) varies.

According to the disk driver having the above-mentioned arrangement, the control voltage CONTV is taken out from the PLL•synchronous signal separating circuit and it is fed through the lowpass filter to the RFVCO. Further, the characteristic of the RF amplifier is varied with the use of the output clock of the RFVCO. In this case, the characteristic of the RF amplifier or the frequency of the output clock of the RFVCO roughly follows the data rate in comparison with the case where the characteristic of the RF amplifier is varied with the use of the bit clock PLCK. As at the time of the seek operation upon CAV reproduction, even if the data rate irregularly varies, the RF amplifier control circuit (frequency divider 26, lowpass filter 30 and RFVCO 31) involves no abnormal conditions and finally the characteristic of the RF amplifier can be accurately matched to the data rate subsequent to the seek operation, so that there occurs less error because of the performing of accurate equalize-processing.

FIG. 10 shows a main section of a disk driver according to a second embodiment of the present invention.

The disk driver of the second embodiment is characterized in that, as a control clock for varying the characteristic of the RF amplifier (equalizer), use is made of a bit clock PLCK or a clock from a crystal oscillator. The previously explained example was directed to the technique of preventing any abnormal condition (uncontrollable conditions) from occurring in the feedback loop for controlling the characteristic of the RF amplifier. According to the second embodiment, proposal is made of the technique which, when any abnormal condition occurs in the feedback loop, enables a normal condition to be regained in the feedback loop. That is, according to the present invention, a clock from the crystal oscillator is used for a regaining operation.

The disk driver of the present invention is different from that of FIG. 1 with respect to the control section of the RF amplifier, that is, the arrangement of a feedback loop comprising frequency dividers 26, 51 and a switching circuit 50. The remaining parts other than the feedback loop are the same as those of FIG. 1 and any further explanation on the parts is therefore omitted.

Hereinbelow, all the circuit blocks in the feedback loop will be briefly referred to as an RF amplifier control circuit. The arrangement of a PLL•synchronous signal separating circuit 19 will be as shown in FIG. 2 for example. A bit clock PLCK in FIG. 2 is input to the RF amplifier control circuit.

Stated in more detail, the bit clock PLCK is input to the switching circuit 50. Further, a clock generated at a crystal oscillator, after being frequency-divided into clocks of a given frequency, is input to the switching circuit 50. The switching circuit 50 selects either one of the bit clock PLCK and output clock of the frequency divider 51 and supplies the selected clock to the frequency divider (feedback circuit) 26.

The frequency divider 51 has two functions of enabling the clock of a very high frequency which is generated at the crystal oscillator to be changed to a clock of a given frequency and enabling a clock of an optimal frequency to be generated, when the RF amplifier control circuit is in an abnormal state, this clock to be supplied to the RF amplifier 15 in place of the bit clock PLCK and the RF amplifier control circuit to be restored back to a normal state.

The switching circuit 50 is controlled by a system controller 25. When the control of the RF amplifier 15 is in a normal state, the switching circuit 50 outputs the bit clock PLCK. The bit clock PLCK becomes a control clock for the RF amplifier 15 by the frequency divider 26. When the control of the RF amplifier 15 is in an abnormal state, the switching circuit 50 outputs the output clock of the frequency divider 51. This output clock becomes a control clock of the RF amplifier 15 by the frequency divider 26.

The disk driver of the present embodiment is effective to, at a time of any abnormal state as shown in the line C in FIG. 5, restore this back to a normal state.

In the disk driver of FIG. 1, as set out above, the feedback loop, that is, the RF amplifier control circuit, is liable to be brought to an abnormal state at a time of a seek operation upon CAV reproduction. According to the second embodiment, therefore, when the RF amplifier control circuit becomes an abnormal state (line C in FIG. 5), this state is detected by the system controller and, through the switching circuit 50, the output clock of the frequency divider 51 is supplied to the frequency divider 26. Further, based on a result of the detection by the RF amplifier control circuit of an abnormal state, the frequency of the output clock from the frequency divider 51 is set to a frequency, or its near frequency, for restoring back to the normal state.

By such control it is possible to, even if the RF amplifier control circuit becomes an abnormal state, immediately regain a normal state and operate the system stably and involve less error.

In the above-mentioned embodiment, the frequency divider 51 can be omitted. In this case, a crystal oscillator is connected directly to the switching circuit 50. Further, the clock output from the crystal oscillator is input to the switching circuit 50. When the switching circuit 50 selects the clock output from the crystal oscillator, the frequency divider 26 divides the frequency of the clock output from the crystal oscillator and outputs a clock of a predetermined frequency which regains the feedback loop from an abnormal state back to a normal state.

FIG. 11 shows a major section of a disk driver according to a third embodiment of the present invention.

The disk driver of the third embodiment has the feature of the first invention of FIG. 6 and that of the second embodiment of FIG. 10.

That is, according to the present invention, a feedback loop for controlling an RF amplifier (equalizer) involves less abnormal state because of the presence of a lowpass filter 30 and RFVCO 31 and, when the feedback loop is in an abnormal state it can be readily regained back to a normal state by the output clock of the frequency divider 51.

The disk driver of the third embodiment will be explained below.

The disk driver of the third embodiment is different from that of FIG. 6 with respect to the arrangement of the control section of the RF amplifier, that is, the arrangement of the feedback loop comprising frequency dividers 26, 51, lowpass filter 30, RFVCO 31 and switching circuit 50. The remaining portion of the device other than the feedback loop is the same as that of FIG. 6 and any further explanation of it is, therefore, omitted.

The arrangement of the PLL•synchronous signal separating circuit 19 is, for example, as shown in FIG. 7.

Stated in more detail, a control voltage CONTV emerges as a control voltage CONTAVD from a lowpass filter 30. The control voltage CONTVD is supplied to the RFVCO 31.

The arrangement and characteristic of the RFVCO 31 is substantially the same as those of the VCO in the PLL•synchronous signal separating circuit 19.

The output clock PLCKD of the PFVCO 31 is input to the switching circuit 50. A clock from a crystal oscillator is frequency divided to provide a clock of a given frequency. This clock is input to the switching circuit 50. The switching circuit 50 selects either one of an output clock of the RFVCO 31 and output clock of the frequency divider 51 and the selected clock is supplied to the frequency divider (feedback circuit) 26.

The frequency divider 51 has two functions of enabling a clock of a very high frequency which is generated from the crystal oscillator to be converted to a clock of a predetermined frequency and, when the RF amplifier control circuit becomes an abnormal state (uncontrollable state), enabling a clock of an optimal frequency to be generated, this clock to be supplied to the RF amplifier 15 and the RF amplifier control circuit to be restored back to a normal state.

The switching circuit 50 is controlled by a system controller 25. When the control of the RF amplifier 15 is in a normal state, the switching circuit 50 outputs the output clock of the RFVCO 31. This output clock becomes a control clock for the RF amplifier 15 by the frequency divider 26. When the control of the RF amplifier 15 is in an abnormal state, the switching circuit 50 outputs the output clock of the frequency divider 51. This output clock becomes a control clock for the RF amplifier by the frequency divider 26.

In the disk driver of this embodiment, even if any abnormal state as indicated by a line C in FIG. 5 occurs in the RF amplifier control circuit, the RF amplifier control circuit can be readily restored back to a normal state by using the output clock of the frequency divider 51 as a control clock for the RF amplifier.

In the disk driver of FIG. 6, there is an advantage, as set out above, that, at the time of the seek operation upon CAV reproduction, it is possible to remarkably reduce an abnormal state, if any, in the feedback loop, that is, in the control circuit for the RF amplifier. In the disk driver of FIG. 6, if an abnormal state is produced in the RF amplifier circuit, it becomes very difficult to, as in the conventional case, restore the circuit back to a normal state.

According to this embodiment, when an abnormal state is produced in the RF amplifier control circuit (line C in FIG. 5), this state is detected by the system controller and, by the switching circuit 50, the output clock of the frequency divider 51 is provided to the frequency divider 26. Further, based on a result of the detection by the RF amplifier control circuit of such a state, the frequency of an output clock from the frequency divider 51 is set to a frequency, or its near frequency, for restoring back to the normal state.

By effecting such control, even if the RF amplifier control circuit is in an abnormal state, this state can be immediately restored back to a normal state and the system operates stably, thus producing less error.

In the above-mentioned embodiment, the frequency divider 51 can be omitted. In this case, a crystal oscillator is connected directly to the switching circuit 50. Further, the clock output from the crystal oscillator is input to the switching circuit 50. When the switching circuit 50 selects the clock output from the crystal oscillator, the frequency divider 26 divides the frequency of the clock output from the crystal oscillator and outputs a clock of a predetermined frequency which regains the feedback loop from an abnormal state back to a normal state.

According to the first to third inventions, as set out above, a control voltage CONTAV is taken out from the PLL·synchronous signal separating circuit and it is supplied through the lowpass filter to the RFVCO. Further, the characteristic of the RF amplifier is varied by using an output clock of the RFVCO. In this case, the characteristic of the RF amplifier or the frequency of the output clock of the RFVCO roughly follows the data rate in comparison with the case where the characteristic of the RF amplifier is varied by the use of a bit clock PLCK. Even if, therefore, at the time of the seek operation upon CAV reproduction, the data rate irregularly varies, the RF amplifier control circuit involves less abnormal state and, finally, the characteristic of the RF amplifier can be accurately matched to the data rate subsequent to the seek operation, so that there occurs less error because equalize-processing is performed accurately.

Further, according to the second and third embodiments of the present invention, it is possible to, as a control clock for varying the characteristic of the RF amplifier, use a bit clock PLCK or a clock output from the crystal oscillator. That is, with the RF amplifier control circuit in an abnormal state, this circuit can be readily brought back to a normal state by using a control clock generated from the crystal oscillator and frequency divider.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A disk driver comprising:
an equalizer, in regard to an RF signal constituted by a plurality of components of mutually different frequencies based on data read from a disk, determining a relation between the frequencies and gains based on a control clock, and performing equalize-processing by adjusting the gains of the components based on the relation;
a data slice circuit converting the components to digital signals;
a PLL circuit having a first VCO to generate a bit clock and generating a first control voltage for controlling the first VCO based on the digital signals;
a lowpass filter generating a second control voltage based on the first control voltage;
a second VCO controlled by the second control voltage and having an arrangement and characteristic substantially equal to those of the first VCO; and
a feedback circuit generating the control clock based on a clock output from the second VCO and supplying the control clock to the equalizer.

2. A disk driver according to claim 1, wherein the equalize-processing is performed by making the gains of high frequency-side components of the plurality of components higher than the gains of low frequency-side components of the plurality of components.

3. A disk driver according to claim 1, wherein the equalizer shifts a peak position of the gain based on the control clock.

4. A disk driver according to claim 1, further comprising a pickup for irradiating the disk with a laser beam and for generating the data based on a reflected laser beam from the disk.

5. A disk driver according to claim 4, further comprising a servo control circuit which generates a signal for driving the pickup based on a servo control signal, the servo control signal being generated by the equalizer based on the data.

6. A disk driver according to claim 1, further comprising:
a disk motor for driving the disk;
a synchronous signal separating circuit for generating a synchronous signal synchronous with a data rate based on the digital signals; and
a disk motor control circuit for monitoring a rotation speed of the disk in a CAV mode, and setting the rotation speed of the disk substantially constant in the CAV mode, and for controlling the rotation speed of the disk based on the synchronous signal in a CLV mode.

7. A disk driver according to claim 1, wherein the feedback circuit divides the clock output from the second VCO to output the control clock.

8. A disk driver comprising:
an equalizer, in regard to an RF signal constituted by a plurality of components of mutually different frequencies based on data read from a disk, determining a relation between the frequencies and gains based on a control clock, and performing equalize-processing by adjusting the gains of the components based on the relation;
a data slice circuit converting the components to digital signals;
a PLL circuit having a VCO to generate a bit clock and generating a control voltage for controlling the VCO based on the digital signals;
a feedback circuit generating the control clock based on either one of the bit clock and a clock having a predetermined frequency and supplying the control clock to the equalizer; and
a selector supplying either one of the bit clock and the clock having the predetermined frequency to the feedback circuit.

9. A disk driver according to claim 8, wherein the feedback circuit includes a divider dividing one of the bit clock and the clock having the predetermined frequency to generate the control clock.

10. A disk driver according to claim 8, wherein the clock having the predetermined frequency is obtained by dividing a clock output from a crystal oscillator.

11. A disk driver according to claim 8, wherein the equalize-processing is performed by making the gains of high-frequency side components of the plurality of components higher than the gains of low-frequency side components of the plurality of components.

12. A disk driver according to claim 8, wherein the equalizer shifts a peak position of the gains based on the control clock.

13. A disk driver according to claim 8, further comprising a pickup for irradiating the disk with a laser beam and for generating the data based on a reflected laser beam from the disk.

14. A disk driver according to claim 13, further comprising a servo control circuit which generates a signal for driving the pickup based on a servo control signal, the servo control signal being generated by the equalizer based on the data.

15. A disk driver according to claim 8, further comprising:
a disk motor for driving the disk;
a synchronous signal separating circuit for generating a synchronous signal synchronous with a data rate based on the digital signals; and a disk motor control circuit for monitoring a rotation speed of the disk and setting the rotation speed of the disk substantially constant in the CAV mode, and for controlling the rotation speed of the disk based on the synchronous signal in a CLV mode.

16. A disk driver according to claim 8, wherein the selector supplies the clock having the predetermined frequency to the feedback circuit when the equalize-processing by the equalizer is in an abnormal state and supplies the bit clock to the feedback circuit when the equalize-processing by the equalizer is in a normal state.

17. A disk driver comprising:

an equalizer, in regard to an RF signal constituted by a plurality of components of mutually different frequencies based on data read from a disk, determining a relation between the frequencies and gains based on a control clock, and performing equalize-processing by adjusting the gains of the components based on the relation;

a data slice circuit for converting the components to digital signals;

a PLL circuit having a first VCO to generate a bit clock and generating a first control voltage for controlling the first VCO based on the digital signals;

a lowpass filter generating a second control voltage based on the first control voltage;

a second VCO controlled by the second control voltage and having an arrangement and characteristic substantially equal to those of the first VCO;

a feedback circuit generating the control clock based on either one of a clock output from the second VCO and a clock having a predetermined frequency and supplying the control clock to the equalizer; and a selector supplying either one of the clock output from the second VCO and the clock having the predetermined frequency to the feedback circuit.

18. A disk driver according to claim 17, wherein the feedback circuit includes a divider dividing one of the clock output from the second VCO and the clock having the predetermined frequency to generate the control clock.

19. A disk driver according to claim 17, wherein the clock having the predetermined frequency is obtained by dividing a clock output from a crystal oscillator.

20. A disk driver according to claim 17, wherein the selector supplies the clock having the predetermined frequency to the feedback circuit when the equalize-processing by the equalizer is in an abnormal state and supplies the clock output from the second VCO to the feedback circuit when the equalize-processing by the equalizer is in the normal state.

* * * * *

UNITED STATES PATENT AND TRADEMARK OFFICE
CERTIFICATE OF CORRECTION

Page 1 of 1

PATENT NO. : 6,236,632 B1
DATED : May 22, 2001
INVENTOR(S) : George M. Walley, William D. Killen, Michael P. Zeitfuss It is certified that error appears in the above-identified patent and that said Letters Patent is hereby corrected as shown below:

<u>Title page,</u>
Item [75], Inventors, delete: William D. Killen; Michael P. Zeitfuss, both Satellite Beach, FL", insert -- William D. Killen, Palm Bay, FL (US); and Michael P. Zeitfuss, Satellite Beach, FL (US) --

<u>Column 1,</u>
Line 9, delete "09,294,940" insert -- 09/294,940 --

Signed and Sealed this

Fifteenth Day of January, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO.   : 6,236,632 B1
DATED        : May 22, 2001
INVENTOR(S)  : Yasuhiro Hayashi It is certified that error appears in the above-identified patent and that said Letters Patent is hereby corrected as shown below:

This certificate supersedes certificate of correction issued January 15, 2002, the number was erroneously mentioned and should be deleted since no certificate of correction was granted.

Signed and Sealed this

Fourth Day of June, 2002

Attest:

Attesting Officer

JAMES E. ROGAN
*Director of the United States Patent and Trademark Office*